United States Patent [19]
Tanifuji et al.

[11] Patent Number: 5,627,344
[45] Date of Patent: May 6, 1997

[54] MULTILAYER CERAMIC CIRCUIT SUBSTRATE, PROCESS FOR PRODUCING THE SAME, AND ELECTRICALLY CONDUCTIVE MATERIAL FOR USE IN MULTILAYER CERAMIC CIRCUIT SUBSTRATE

[75] Inventors: Nozomi Tanifuji; Akihiko Naito, both of Nagoya; Koji Sawada, Konan; Tohru Nomura, Kariya; Yoshiyuki Miyase, Okazaki; Takashi Nagasaka, Anjo, all of Japan

[73] Assignees: Sumitomo Metal Ceramics Inc., Yamaguchi; Nippondenso Co., Ltd., Aichi, both of Japan

[21] Appl. No.: 362,129

[22] Filed: Dec. 22, 1994

[30] Foreign Application Priority Data

Dec. 27, 1993 [JP] Japan ................. 5-330831

[51] Int. Cl.$^6$ ................................................. H05K 1/09
[52] U.S. Cl. ......................... 174/257; 174/256; 361/751
[58] Field of Search ........................... 174/256, 257, 174/258; 361/750, 751

[56] References Cited

U.S. PATENT DOCUMENTS

| | | | |
|---|---|---|---|
| 4,529,835 | 7/1985 | Mizuno | 174/68.5 |
| 4,685,030 | 8/1987 | Reyes et al. | 361/400 |
| 4,770,953 | 9/1988 | Horiguchi et al. | 428/698 |
| 4,861,641 | 8/1989 | Foster et al. | 428/137 |
| 5,153,077 | 10/1992 | Kashiba et al. | 428/627 |
| 5,156,903 | 10/1992 | Okumura et al. | 428/209 |

FOREIGN PATENT DOCUMENTS 0249755  11/1990  European Pat. Off. .
2149222   6/1985  United Kingdom .

OTHER PUBLICATIONS

Patent Abstracts of Japan, vol. 15, No. 459, 21 Nov. 1991.
Database WPI, Week 8728, Derwent Publications Ltd., London, GB; AN 87–194926.

*Primary Examiner*—Laura Thomas
*Attorney, Agent, or Firm*—Flynn, Thiel, Boutell & Tanis, P.C.

[57] ABSTRACT

A multilayer ceramic circuit substrate having therein internal conductor patterns comprising W and/or Mo as a main component and surface conductor patterns comprising Cu as a main component formed onto a surface layer of the multilayer ceramic circuit substrate, wherein an intermediate metal layer comprising 40 to 90 wt. % of W and/or Mo and 10 to 60 wt. % of at least one element selected from the group consisting of Ir, Pt, Ti, and Cr is formed in through-holes of the surface layer and on parts of the surface layer in the vicinity of the through holes on the surface layer, whereby the internal conductor patterns and the surface conductor patterns are electrically connected through the intermediate metal layer. The alumina multilayer ceramic circuit substrate provides an excellent bonding strength and electrical conductivity between the internal conductors and the surface conductors and enables high precision wiring and miniaturization of an electronic circuit part.

6 Claims, 2 Drawing Sheets

MULTILAYER CERAMIC CIRCUIT SUBSTRATE, PROCESS FOR PRODUCING THE SAME, AND ELECTRICALLY CONDUCTIVE MATERIAL FOR USE IN MULTILAYER CERAMIC CIRCUIT SUBSTRATE

BACKGROUND OF THE INVENTION

1. Field of the Invention

The present invention relates to a multilayer ceramic circuit substrate to be used as an electronic circuit part, a process for producing the same, and an electrically conductive material to be used in production of the same.

2. Description of the Prior Art

In a conventional multilayer ceramic circuit substrate for use in an integrated circuit, conductors of a high-melting metal are built in, and the internal conductors are exposed over through-holes of a surface layer of the substrate, where they are connected to surface conductors each made of a thick film comprising copper as a main component. The foregoing structure involves demerits of a high contact resistance and a weak bonding strength.

In view of the above, proposals with a view to preventing such demerits have been made, an example of which is disclosed in Japanese Patent Application Laid-Open No. 218,693/1991. A specific description will be made while referring to FIG. 3. After green sheets constituting electrically insulating layers 11 and internal conductors 12 are cofired, the exposed portions of the internal conductors 12 over through-holes 13 of the surface layer of the substrate are covered with a metallo-organic paste comprising Pt, Pd, or the like, which is then fired to form metallized layers 14, which are then coated and covered with a paste comprising Cu as a main component by printing or the like, followed by firing to form surface conductors 15 each in the form of a copper thick film.

The foregoing conventional instance is excellent as a multilayer circuit substrate, but still has room for a further improvement. For example, the firing steps are three steps: cofiring of the laminated green sheets having the internal conductors therein, firing of the metallized layers, and firing for formation of the surface conductors. Thus, a further decrease in the number of steps is desired. Furthermore, since firing involves deviations of dimensions, the internal conductors are liable to be partly in direct contact with the surface conductors to cause a failure in connection unless wide surroundings around the through hole portions are perfectly covered with the metallized layers. Thus, the wide-area metallized layers are formed in an aspect of safety to fail to completely meet the requirements for further miniaturization of wiring patterns. When chip parts are soldered onto the surface conductors, the durability of the through-hole portions is deteriorated by soldering heat to make them unusable as lands for mounting components. Accordingly, the through-hole portions are covered with protective materials, outside of which the surface conductors are extended out to solder chip parts onto the extended-out portions thereof. This also presents a problem in further miniaturization of wiring patterns.

On the other hand, Japanese Patent Application Laid-Open No. 196,696/1991 discloses a multilayer ceramic circuit substrate having an intermediate metallic layer of an alloy of at least one of Ni and Co with at least one of W and Mo between an internal conductor comprising W and/or Mo as a main component and a surface conductor comprising Cu as a main component, wherein the intermediate metallic layer is provided for the purpose of improving adhesion and electrical conductivity between the internal conductor and the surface conductor. After a laminated insulating green sheets having the internal conductor patterns are cofired, the intermediate metallic layer is formed by electroplating, electroless plating, or the like on the exposed outer surface of the internal conductors onto which surface the surface conductor is to be bonded. Thereafter, an electrically conductive Cu paste is applied onto the intermediate metallic layer by printing, and then fired to form the above-mentioned surface conductor. Accordingly, the foregoing procedure inevitably involves three steps: cofiring of the green sheets and the internal conductor patterns, formation of the intermediate metallic layer, and formation of the layer of the surface conductor to fail to decrease the number of steps as well.

SUMMARY OF THE INVENTION

The present invention provides a multilayer ceramic circuit substrate of high productivity and high quality which can meet the requirements for further miniaturization thereof.

In accordance with a first aspect of the present invention, there is provided a multilayer ceramic circuit substrate having therein internal conductor patterns comprising W and/or Mo as a main component and surface conductor patterns comprising Cu as a main component formed onto a surface layer of one side or both sides of the multilayer ceramic circuit substrate wherein an intermediate metal layer comprising 40 to 90 wt. % of W and/or Mo and 10 to 60 wt. % of at least one element selected from the group consisting of Ir, Pt, Ti, and Cr is formed in through-holes of the surface layer and exposed onto an area of the surface layer in the vicinity of the through holes, whereby the internal conductor patterns and the surface conductor patterns are electrically connected through the intermediate metal layer.

According to the present invention, the quality of the substrate is stabilized by forming in the through holes the intermediate metal layer comprising 40 to 90 wt. % of W and/or Mo and 10 to 60 wt. % of at least one element selected from the group consisting of Ir, Pt, Ti, and Cr and connecting the internal conductors to the surface conductors through the through holes.

A second aspect of the present invention provides a process for producing the foregoing multilayer ceramic circuit substrate, the process comprising:

(a) providing electrically insulating ceramic green sheets having through holes formed therein;

(b) partially or wholly filling through holes formed in a surface green sheet with an electrically conductive paste comprising 40 to 90 wt. % of W and/or Mo powder and 10 to 60 wt. % of powder of at least one element selected from the group consisting of Ir, Pt, Ti, and Cr mutually mixed together with an organic binder and filling the remaining through holes with an electrically conductive paste comprising W and/or Mo as a main component;

(c) printing the electrically conductive paste comprising W and/or Mo as a main component so as to form internal conductor patterns onto the surfaces of the green sheets except for the surface green sheet;

(d) laminating the thus treated green sheets;

(e) cofiring the laminated green sheets;

(f) applying a paste comprising Cu as a main component to form surface conductor patterns; and (g) firing the surface conductor patterns, said surface conductor patterns being electrically connected to the internal conductor patterns through an intermediate metal layer formed from the conductive past filled into the through holes of the surface green sheet.

In this process, the above-mentioned surface green sheet becomes either one or both surface layers of the resultant multilayer ceramic circuit substrate. In the latter case, the conductive paste for the intermediate layer are filled into the through holes of both surface green sheets and the surface conductors are also formed onto the intermediate layers formed on both faces of the substrate.

According to this process, the firing and plating steps of forming the metallized layers in the prior art technology can be dispensed with, and the laminated green sheets can be cofired with the intermediate metal layer represented by W-Ir.

A third aspect of the present invention is to provide an electrically conductive material used in the preparation of the above-mentioned multilayer ceramic circuit substrate, the material comprising 40 to 90 wt. % of W and/or Mo powder and 10 to 60 wt. % of powder of at least one element selected from the group consisting of Ir, Pt, Ti, and Cr mutually mixed together with an organic binder.

The multilayer ceramic circuit substrate of the present invention is excellent in adhesion between the internal conductors and the surface conductors thereof, and hence excellent in bonding strength and electrical conductivity. Further, according to the present invention, since precise wiring patterns can be firmed, miniaturization of an electronic circuit part can be achieved. Furthermore, according to the process of the present invention, part of firing steps as involved in the prior art technology can be dispensed with, and the deviation of dimensions in products is so low that high-value-added multilayer ceramic circuit substrates can be produced with a high productivity.

DETAILED DESCRIPTION OF THE PREFERRED EMBODIMENTS

Figure 1:
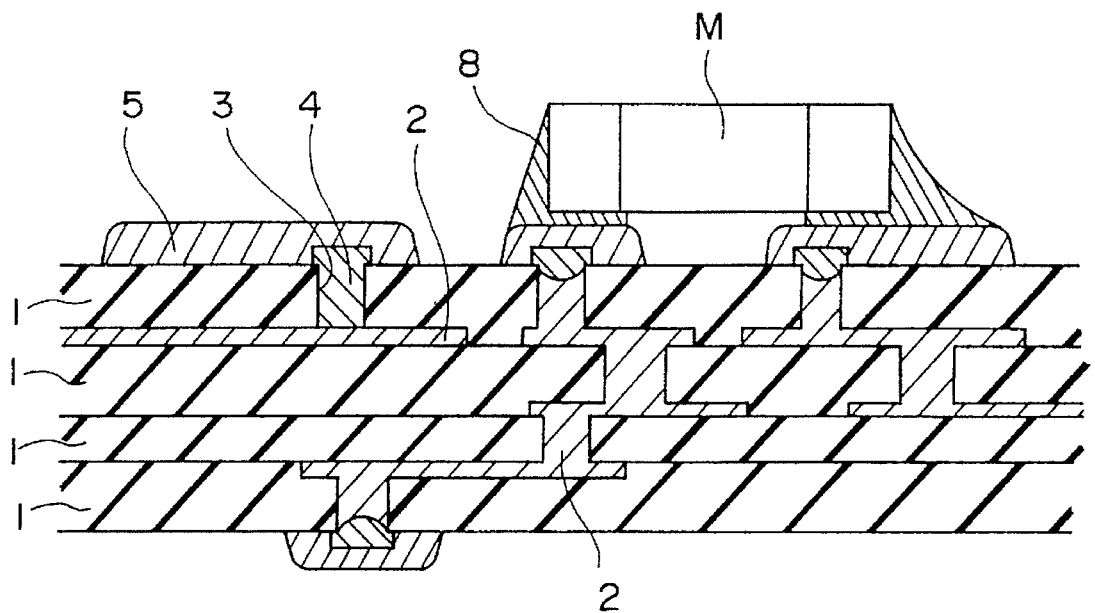
FIG. 1 is a sectional view of an example according to the present invention.

Examples of the ceramics as the substrate material of the present invention include alumina, mullite, alumina nitride, etc.

Further, Ir, Pt, Ti, and Cr usable in the intermediate metal layer are metals capable of suppressing the reducing power of W and/or Mo. A representative example of a combination of the former with W and/or Mo is W and Ir and this combination is specifically described hereinafter in which an alumina substrate is used by way of example.

Specifically, Ir is subjected to solid solution and alloyed with W by sintering to decrease the amount of elemental W to thereby suppress the reducing power of W, which acts on a Cu paste during sintering of the surface-layer conductor, whereby the sintering reaction of the Cu thick film can be stabilized to turn it into a dense film high in strength and electrical conductivity. Further, a small amount of Ir dissolves in the state of solid solution in Cu in the step of firing the Cu thick film to form a firm bonding layer around the interface between the Cu thick film and the intermediate metal layer of W and Ir to thereby improve the bonding strength of the Cu thick film. When the Ir content is lower than 10 wt. %, the amount of Ir alloyed with W is small and a large amount of elemental W remains. Therefore, that the reducing power of W cannot well be suppressed because of such a large amount of remaining elemental W. On the other hand, when the Ir content exceeds 60 wt. %, a difference in sintering properties between Ir powder and ceramic green sheets such as alumina is enlarged during cofiring with the green sheets to deteriorate the reliability of the through holes, while the high Ir content is unsuitable in an economic aspect. The Ir content is more desirably 35 to 50 wt. %.

The intermediate metal layer of W and Ir may account for either the majority or part of the through hole in the surface layer. Further, if necessary, up to 30 wt. %, in terms of outer percentage, of $Al_2O_3$ may be included with W and Ir in the intermediate metal layer in the case of the foregoing alumina substrate. Alternatively, when another ceramic material, such as mullite, aluminum nitride or the like is used as the substrate material, a ceramic additive consisting essentially of the substrate material may also be incorporated into the intermediate metal layer in amount of not greater than 30 wt. %, in terms of outer percentage, similarly to the alumina substrate. These additives lower the probability that a difference in thermal shrinkage during cofiring between the corresponding substrate material and a paste filled in the through hole for forming the intermediate metal layer is otherwise enlarged, for example, in the case of a large hole diameter of the through-hole portion of the substrate to cause deviation of dimensions due to warpage of the substrate and the like. When the amount of the ceramic additive to be admixed exceeds 30 wt. %, the influence thereof on the electrical conductivity of the intermediate metal layer is unfavorably increased. The amount of the ceramic additive is more desirably 5 to 20 wt. %. Throughout the specification, the percentages of the ceramic additive are all represented by outer percentages by weight, i.e., percentages by weight based on the total weight of the other components of the intermediate metal layer, i.e., W and/or Mo and at least one element selected from the group consisting of Ir, Pt, Ti, and Cr, unless otherwise specified.

The multilayer ceramic circuit substrate of the present invention is produced in accordance with the process as mentioned above. First, green sheets are prepared in a conventional manner, using a ceramic material, such as alumina, mullite or aluminum nitride and through holes are formed in the green sheets by punching or other known methods. The formed through holes are filled with a conductive filler paste and a conductive paste is printed onto the green sheets, except for the surface green sheet to be a surface layer of the resultant multilayer ceramic substrate, to form internal conductor patterns using known techniques. Then, the green sheets are stacked together into a laminated structure and cofired. Subsequently, surface conductor patterns are formed onto the surface layer of the laminated structure by applying a Cu conductive past and firing it.

In the above procedure, the inventive intermediate metal layer is formed by filling through holes as connection portions between the internal conductors and the surface-layer conductors with the above-specified paste comprising W and Mo with at least one element selected from the group consisting of Ir, Pt, Ti and Cr mutually mixed together with an organic binder and cofired with the laminated green sheets. When the inventive conductive paste for forming the intermediate metal layer may be used in the through holes of surface green sheet(s) for either one or both faces of the multilayer ceramic substrate and, accordingly, the surface conductor patterns may be formed on either one or both sides of the substrate.

In the paste used for the formation of the intermediate metal layer, the functions of metals represented by W and Ir are as described hereinbefore and a common example of the organic binder for use in preparation of the paste is an ethyl cellulose resin as a main component dissolved in a solvent. An example of the thick conductor film-forming paste comprising Cu as a main component is a commercially available product under the trade name of Du Pont #9922.

As has been described, in the electrically conductive paste used for the formation of the intermediate metal layer comprising 40 to 90 wt. % of powdered W and/or Mo and 10 to 60 wt. % of powder of at least one element selected from the group consisting of Ir, Pt, Ti, and Cr mutually mixed together with an organic binder, the paste may further include up to 30 wt. %, in terms of outer percentage, of alumina powder, mullite powder or aluminum nitride powder, etc., corresponding to the substrate material.

The above-mentioned electrically conductive material is suitable as a material for connecting the internal conductors comprising W and/or Mo powder as a main component to the thick film surface conductors comprising Cu as a main component. As described above, at least one element selected from the group consisting of Ir, Pt, Ti, and Cr is a metal capable of suppressing the reducing power of W and/or Mo. The most preferable combination is W-Ir. As for the W-Ir combination, the functions thereof will be described with reference to FIGS. 1 and 2 in conjunction with an exemplified case where this W-Ir combination is used in an alumina substrate. Laminated alumina green sheets constituting electrically insulating ceramic layers 1 and having through holes 3 including internal conductors 2 over which a material of a W-Ir intermediate metal layer 4 is filled, as shown in FIG. 2. The laminated alumina green sheets are subjected to cofiring to effect solid solution of Ir into W to thereby form an alloy, while effecting solid solution of part of Ir with W in the internal conductor 2 in the interface 6 thereof to secure a firm bond. Subsequently, a paste comprising Cu as a main component for forming a thick film conductor layer 5 is applied around the W-Ir intermediate metal layer 4 in and over the through hole 3 of the alumina insulating layer 1, and then fired to effect solid solution of part of Ir with Cu in the interface 7 of the intermediate metal layer 4 with the Cu thick film to thereby form a firm bonding layer, whereby the bonding strength of the Cu thick film can be improved. Further, the amount of the component of elemental W having a strong reducing power against Cu is decreased by Ir as described hereinbefore to stabilize the sintering reaction of the Cu thick film to thereby form a thick dense surface conductor film having a high strength.

Although the foregoing description has been made mainly about the W-Ir combination used in a multilayer alumina ceramic substrate, a combination of Mo and Ir as well as other combinations of W and/or Mo with at least one element selected from the group consisting of Pt, Ti and Cr can secure substantially the same effects. Further, when another ceramic material, such as mullite, aluminum nitride, etc., is used in place of alumina, similar effect can be obtained.

The following Examples will illustrate the present invention in comparison with Comparative Examples in detail.

Figure 2:
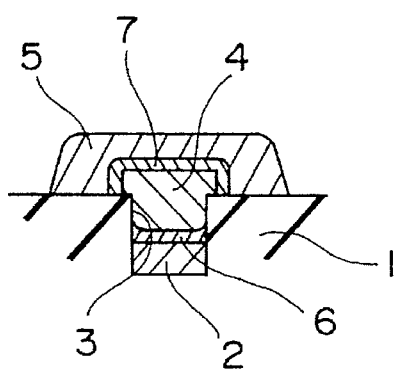
FIG. 2 is a diagram illustrating the functions of an essential part according to the present invention.
Figure 3:
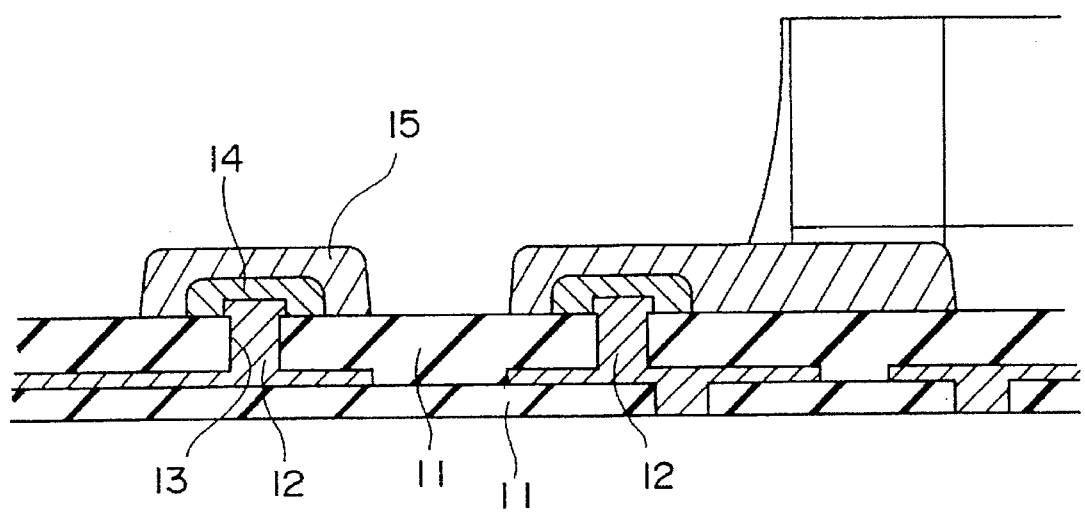
FIG. 3 is an illustration of a conventional example.

FIG. 1 shows an example of a product according to the present invention, which comprises internal conductors 2 disposed inside a multilayer alumina substrate composed of insulating ceramic layers 1, intermediate metal layers 4 comprising W and/or Mo and at least one element selected from the group consisting of Ir, Pt, Ti, and Cr and filled in the through holes 3 of the surface layers of the multilayer substrate, and Cu thick film layers 5 formed around the through holes. A chip part M is finally mounted on the Cu thick film layers thorough a bonding material 8 such as solder.

EXAMPLE 1

A tungsten (W) powder of 3 to 4 μmφ in average particle size was admixed with an Ir powder having substantially the same particle size distribution as the W powder, and then mixed with an organic binder comprising as a main component an ethyl cellulose resin dissolved in a solvent to prepare a paste. The paste was filled into the through-hole portions of a surface alumina green sheet, which becomes the surface layer of a multilayered ceramic substrate after firing, by filling printing. A W conductive paste was filled into through holes of other alumina green sheets and then printed in internal conductor patterns onto the green sheets. The thus treated green sheets were stacked together into a laminated structure and then cofired. Subsequently, a commercially available Cu paste (#9922 manufactured by Du Pont Company) was applied on the surface layer with the through holes as centers by printing to form printed layers of 2 mm×2 mm square in size, followed by firing to produce a product. The bonding strength of the product was evaluated in terms of initial strength and strength after keeping thereof at a high temperature of 150° C. The measurement method was as follows. The product was immersed in a molten solder bath having a temperature of 235°±5° C. Lead wires (wire diameter: 0.6 mmφ) for a tensile test were soldered onto the lands of 2 mm×2 mm square in size on the product. The initial bonding strength and the bonding strength after keeping at 150° C. for 1,000 hours were measured by a peeling tensile test method.

The paste compositions and bonding strengths of products as well as ratings of evaluation are shown in Table 1. Test results of paste compositions falling outside the range as specified in the present invention are also shown as Comparative Example 1 in Table 1. Additionally stated, No. 10 of the Comparative Example 1 is concerned with metallized layers formed from a Pt metallo-organic paste on a W film. In Table 1, the marks "o" and "x" indicate "good" and "no good", respectively.

TABLE 1

| | No. | W | Ir | alumina (outer percentage) | Initial Strength | After Keeping at High. Temp. | Remarks | Rating |
|---|---|---|---|---|---|---|---|---|
| | | Paste Composition (wt. %) | | | Bonding Strength (average value) kgf/2 mm × 2 mm | | | |
| Ex. 1 | 1 | 85 | 15 | 5 | 4.7 | 3.7 | | o |
| | 2 | 65 | 35 | 0 | 5.4 | 4.1 | | o |
| | 3 | 60 | 40 | 15 | 5.5≦ | 4.3 | The measurement of the upper limit value was impossible due to breakage of a lead wire in the course of measurement of the initial strength. | o |
| | 4 | 50 | 50 | 0 | 5.5≦ | 4.5 | | o |
| | 5 | 50 | 50 | 5 | 5.5≦ | 4.4 | | o |
| | 6 | 60 | 40 | 25 | 5.5≦ | 4.4 | | o |
| Comp. Ex. 1 | 7 | 97 | 3 | 5 | The measurement was impossible due to too low strength. | The measurement was impossible due to too low strength. | | x |
| | 8 | 95 | 5 | 0 | ditto | ditto | | x |
| | 9 | 93 | 7 | 5 | 0.8 | ditto | | x |
| | 10* | 100 | — | — | 4.6 | 1.5 | product with Pt metallized layers formed. | x |

In both of Example 1 and Comparative Example 1, the area rate of solder wetting through immersion in the molten solder bath was so good as to be problem-free in a practical aspect.

In every case of using either a paste having a compositional ratio of W to Ir as shown in Example 1 or a paste further containing alumina powder added thereto, both the initial bonding strength and the bonding strength after the test wherein the product was allowed to stand at the high temperature were high, securing good results. In Comparative Example 1 including No. 10 concerned with the mode of forming the Pt metallized layers, the initial bonding strengths and the bonding strengths after the test wherein products were allowed to stand at the high temperature were all notably low, demonstrating the poorer bonding performances than in Example 1.

EXAMPLE 2

Substantially the same procedure as in Example 1 except that part of W used in Example 1 was replaced with Mo was repeated to carry out bonding strength tests. The compositions of pastes for forming intermediate metal layers are shown together with the results of the bonding strength tests in Table 2. In Table 2, the mark "o" indicates "good".

TABLE 2

| | No. | Paste Composition (wt. %) | | | Bonding Strength (average value) kgf/2 mm × 2 mm | | Rating |
|---|---|---|---|---|---|---|---|
| | | W | Mo | Ir | Initial Strength | After Keeping at High temp. | |
| Ex. 2 | 1 | 35 | 30 | 35 | 5.2 | 4.0 | o |
| | 2 | 20 | 45 | 35 | 5.0 | 3.8 | o |

EXAMPLE 3

Cases where Pt, Ti, or Cr was used instead of Ir used in Example 1 are shown in Table 3. In Table 3, the mark "o" indicates "good".

TABLE 3

| | No. | Paste Composition (wt. %) | | | | Bonding Strength (average value) kgf/2 mm × 2 mm | | Rating |
|---|---|---|---|---|---|---|---|---|
| | | W | Pt | Ti | Cr | Initial Strength | After Keeping at High temp. | |
| Ex. 3 | 1 | 65 | 35 | | | 3.0 | 2.3 | o |
| | 2 | 65 | | 35 | | 2.7 | 2.0 | o |
| | 3 | 65 | | | 35 | 2.8 | 2.1 | o |

As is apparent from the foregoing, since the bonding strengths between intermediate metal layers formed in through-hole portions and the Cu surface conductor layers are very high in the multilayer ceramic circuit substrate of the present invention as compared with those in the conventional multilayer ceramic circuit substrates, they are little deteriorated not only in the subsequent steps but also during the course of long-term service of the multilayer ceramic circuit substrate, which therefore has an excellent durability.

Additionally, the weftability by solder of the Cu conductor layers just on the through hole portions is also improved. Further, since the intermediate metal layers of the multilayer ceramic circuit substrate of the present invention, even if small in area, firmly bond the surface conductors thereof to the internal conductors thereof without direct contact between the two kinds of conductors, the pitches between the through holes can be minimized to minimize the pitches between the surface conductors as well. Accordingly, chips to be mounted between the surface conductors on the substrate can be miniaturized to increase the packaging density thereof while enabling miniaturization of circuit components.

What is claimed is:

1. A multilayer ceramic circuit substrate having therein internal conductor patterns comprising at least one element selected from the group consisting of W and Mo as a main component and surface conductor patterns comprising Cu as a main component formed onto a surface layer of the multilayer ceramic circuit substrate, wherein an intermediate metal layer comprising 40 to 90 wt. % of at least one element selected from the group consisting of W and Mo and 10 to 60 wt. % of at least one element selected from the group consisting of Ir, Pt, Ti, and Cr is formed in through-holes of the surface layer and on parts of the surface layer in the vicinity of the through holes on the surface layer, whereby the internal conductor patterns and the surface conductor patterns are electrically connected through the intermediate metal layer.

2. A multilayer ceramic circuit substrate as claimed in claim 1, wherein the intermediate metal layer further includes at most 30 wt. %, based on 100 wt. % of the metals contained in the intermediate metal layer, of a ceramic additive consisting essentially of a ceramic material constituting the substrate.

3. A multilayer ceramic circuit substrate as claimed in claim 2, wherein the ceramic additive is selected from the group consisting of alumina, mullite and aluminum nitride.

4. An electrically conductive material for use in a multilayer ceramic circuit substrate comprising 40 to 90 wt. % at least one element selected from the group consisting of W and Mo powder and 10 to 60 wt. % of powder of at least one element selected from the group consisting of It, Pt, Ti, and Cr mutually mixed together with an organic binder.

5. An electrically conductive material for use in a multilayer ceramic circuit substrate as claimed in claim 4, which further comprises at most 30 wt. %, based on 100 wt. % of the metals contained in the intermediate metal layer, of ceramic additive powder consisting essentially of a ceramic material constituting the substrate.

6. An electrically conductive material for use in a multilayer ceramic circuit substrate as claimed in claim 5, wherein the ceramic additive powder is selected from the group consisting of alumina powder, mullite powder and aluminum nitride powder.

* * * * *

UNITED STATES PATENT AND TRADEMARK OFFICE
CERTIFICATE OF CORRECTION

PATENT NO. : 5 627 344
DATED : May 6, 1997
INVENTOR(S) : Nozomi TANIFUJI et al

It is certified that error appears in the above-indentified patent and that said Letters Patent is hereby corrected as shown below:

Column 10, line 8; change "It, Pt, Ti and Cr" to ---Ir, Ti, and Cr---.

Signed and Sealed this

Eighteenth Day of November 1997

Attest:

BRUCE LEHMAN

*Attesting Officer*   *Commissioner of Patents and Trademarks*